(12) United States Patent
Gaebler

(10) Patent No.: US 8,187,908 B2
(45) Date of Patent: May 29, 2012

(54) LIGHT-BLOCKING LAYER SEQUENCE HAVING ONE OR MORE METAL LAYERS FOR AN INTEGRATED CIRCUIT AND METHOD FOR THE PRODUCTION OF THE LAYER SEQUENCE

(75) Inventor: Daniel Gaebler, Apolda Ot Sulzbach (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 56 days.

(21) Appl. No.: 12/740,554

(22) PCT Filed: Oct. 30, 2008

(86) PCT No.: PCT/EP2008/064760
§ 371 (c)(1),
(2), (4) Date: Aug. 17, 2010

(87) PCT Pub. No.: WO2009/056615
PCT Pub. Date: May 7, 2009

(65) Prior Publication Data
US 2010/0301483 A1    Dec. 2, 2010

(30) Foreign Application Priority Data
Oct. 30, 2007 (DE) .......................... 10 2007 051 752

(51) Int. Cl.
*H01L 21/00* (2006.01)

(52) U.S. Cl. ....... 438/69; 438/48; 438/70; 257/E31.122; 257/432; 257/435; 359/290

(58) Field of Classification Search ........... 257/E31.122, 257/E31.121, E31.119, E21.214, E21.575, 257/E23.142, 432, 435–437, 758; 438/48, 438/69, 70, 72, 622; 359/237, 245, 248, 359/252, 253, 290, 833, 834, 885; 428/141, 428/156, 172, 913

See application file for complete search history.

(56) References Cited

U.S. PATENT DOCUMENTS

| 5,061,978 A | 10/1991 | Mizutani et al. | |
|---|---|---|---|
| 6,175,442 B1 * | 1/2001 | Booth et al. | 359/290 |
| 6,649,266 B1 * | 11/2003 | Gross et al. | 428/410 |
| 8,084,798 B2 * | 12/2011 | Koike | 257/294 |

(Continued)

FOREIGN PATENT DOCUMENTS

DE           37 05 173           9/1987

(Continued)

OTHER PUBLICATIONS

International Search Report for PCT/EP2008/064760; Feb. 16, 2009; 3 pages (German language).

(Continued)

*Primary Examiner* — Chris Chu
(74) *Attorney, Agent, or Firm* — Hunton & Williams LLP

(57) ABSTRACT

In an integrated circuit, a light sensitive area is protected against radiation by arranging a light blocking layer sequence (504) on top of the light sensitive area. The light blocking layer sequence comprises one or several metal layers (504a) and a silicon layer (503b, 1) for the purpose of absorption. A moth eye structure is provided on the silicon layer. Thereby, a radiation incident by reflection is minimized in such a way that also stray light can effectively be kept from the light sensitive area below the light blocking layer sequence (504).

13 Claims, 5 Drawing Sheets

U.S. PATENT DOCUMENTS

| | | |
|---|---|---|
| 2003/0178057 A1 | 9/2003 | Fujii et al. |
| 2003/0234341 A1 | 12/2003 | Osborn |
| 2005/0181522 A1 | 8/2005 | Yano et al. |
| 2008/0276990 A1* | 11/2008 | Zhou et al. .................... 136/261 |
| 2009/0286346 A1* | 11/2009 | Adkisson et al. ............... 438/65 |
| 2010/0128350 A1* | 5/2010 | Findlay et al. ................ 359/601 |
| 2010/0244169 A1* | 9/2010 | Maeda et al. ................. 257/432 |
| 2010/0252902 A1* | 10/2010 | Tanida et al. ................. 257/433 |
| 2011/0123777 A1* | 5/2011 | Imaoku et al. ................ 428/172 |
| 2011/0318539 A1* | 12/2011 | Ozawa et al. ................ 428/172 |

FOREIGN PATENT DOCUMENTS

| | | |
|---|---|---|
| EP | 0 450 496 | 10/1991 |
| EP | 0 495 503 | 7/1992 |
| EP | 0 590 598 | 4/1994 |
| EP | 0 816 899 | 1/1998 |
| EP | 1 333 503 | 8/2003 |
| JP | 60-170255 | 9/1985 |
| JP | 62-76570 | 4/1987 |
| JP | 2-376 | 1/1990 |
| WO | WO 2007/042520 | 4/2007 |

OTHER PUBLICATIONS

Written Answer of the International Search Authority for PCT/EP2008/064760; 6 pages (German language).

* cited by examiner

Fig. 4

| | |
|---|---|
| ILD 1 | |
| Contact | |
| Met 1 | |
| ILD 2 | Standard Steps |
| Via 1 | |
| Met 2 | |
| ILD 3 | |
| Ti dep 100 nm | Depositing Light Blocking Arrangement (Sequence of Layers) |
| polydep 2 µm | |
| resist | |
| exposure | |
| UV hardening | Structuring Light Blocking Arrangement (Sequence of Layers) |
| polyetch | |
| Ti etch | |
| resist strip | |
| black Si etch | Functionizing Light Blocking Arrangement (Sequence of Layers) |
| oxide dep | Planarizing Light Blocking Arrangement (Sequence of Layers) |
| CMP | |
| Via 2 | Is probably adapted since ILD 3 becomes thicker around the Light Blocking Arrangement (Sequence of Layers). |
| Met 3 | |
| passivation | Standard Steps |
| pad opening | |

LIGHT-BLOCKING LAYER SEQUENCE HAVING ONE OR MORE METAL LAYERS FOR AN INTEGRATED CIRCUIT AND METHOD FOR THE PRODUCTION OF THE LAYER SEQUENCE

CROSS-REFERENCE TO RELATED APPLICATIONS

The application is a U.S. National Stage Application of International Application of PCT/EP2008/064760 filed Oct. 30, 2008, which claims the benefit of German Patent Application No. 10 2007 051 752.3 filed Oct. 30, 2007, the disclosures of which are herein incorporated by reference in their entirety.

FIELD OF THE DISCLOSURE

The invention relates to the application for light a blocking layer sequence in an integrated circuit. Particularly for devices of the integrated optics in a wavelength range from essentially 180 nm to 1200 nm, Also a method to the preparation is affected. The result is the integrated circuit with the light blocking layer sequence or sequence of layers (LbS).

BACKGROUND OF THE DISCLOSURE

With circuits with integrated optics the frequent need exists to exclude photosensitive areas, which do not belong to the receiving elements for optical radiation, targeted from the irradiation with light. This does not concern the shading effect only, on the contrary it is essential to absorb the light completely so that a suppression of the reflectance as completely as possible results and optical systems are not restricted in their efficiency by reflected or back scattered light. If e.g. an image sensor, which is used in combination with a lens, shows reflectances in the wavelength range used, then this leads to a reduction of the contrast range as with a lens in which the lenses used are not high-quality antireflection coated.

The application of metal layers and layers of black paint corresponds to the state of the art for light screening. In the patent specification EP 0590598 A1 a semiconductor device is described, which includes photodiodes, an integrated circuit surrounding the same and having several levels of metallization, which are electrically insulated by insulating layers from each other, and bonding sites on a chip, where the chip is provided with one or several light shielding layers of metal in the areas outside of the optical windows.

In the Japanese document JP 62 076570 A, a photo sensor with light shielding layers out of aluminum is described. Very similar applications of metal layers for the protection against incident light are in the documents DE 37 05 173 C2, EP 450,496 B1, EP 495,503 B1, JP 02 000376 A, JP 60 170255 A. According to all these publications, metal layers in different arrangements are used for shielding light. With use metal layers for shielding light, e.g. in combination with the CMOS technology, the technological modification is small, however, there exists the significant disadvantage of the high reflectance. The process steps used for the preparation of the metal layers to be efficiently integrated into the production run for the preparation of the circuit elements, e.g. of transistors, however, the reflectances caused by these metal layers lead again to the occurrence of radiation, which can again arrive by scattering at the photosensitive circuit areas to be protected, etc. Another disadvantage is the loss of a wiring plane for wiring in the area which is to be shielded from the light.

With use of black paint, as for example described in EP 816,899 B1, the high remaining transmission is of disadvantage. Paint does not shield by 100%, but still transmits a portion of the light. Another disadvantage exists in the deposition of the paint on the surface of an integrated element. Because of the larger distance to the photosensitive area of the element, which is typically located in the semiconductor plane and thus is remote from the paint by the several levels of metallization and the passivation layer, the edges cannot be defined very precisely. The large distance reduces the overlay accuracy with the structures in the device and leads to the shading of optical active areas and/or, with oblique light incidence, to the irradiation into areas which are to be blocked. This effect becomes stronger the larger the distance is of the black paint to the photosensitive range of the element, the smaller the photosensitive range (the surface of the element) is and the more oblique the light is coupled in. Furthermore, it is not possible to obtain a planar surface since the black paint has to be structured and high edges are developed thereby. Directly applying other layers or components on such a surface is not possible in a simple way.

SUMMARY OF THE DISCLOSURE

The invention is based on the object to create a light blocking layer sequence in an integrated circuit in such a way that the above described disadvantages of the state of the art are eliminated or at least reduced.

In accordance with an aspect of the invention the problem is achieved by an integrated circuit, which comprises an insulating layer applied over a substrate. Furthermore, a light blocking layer sequence is provided on the insulating layer, which sequence includes at least one metal layer arranged on the insulating layer and a silicon layer located on that at least one metal layer, whose surface is provided with a moth eye structure.

As a result of this arrangement no or almost no transmission is given in an interesting wavelength range, for example within the range of 180 nm to 1200 nm, and a much smaller reflectance results from very efficiently coupling the light into the silicon layer with moth eye structure. The light, which enters the silicon layer, becomes efficiently absorbed where the absorption can be set by the absorbance characteristics of the silicon layer, which can be for example provided as polysilicon layer or amorphous silicon layer, and the thickness thereof. By the provided metal layer, a portion of the light which did not become absorbed when crossing the silicon layer once, is reflected and must pass the silicon layer a second time, whereby again a major portion is absorbed. Only the very small portion of the light which is not absorbed also during the further pass, is thus reflected altogether. The reflectance can be influenced by the choice of the metal, the type of the silicon, e.g. silicon with a high absorption factor, and the silicon layer thickness which can be selected the larger the higher the absorption is desired, as well as the nature of the moth eye structure in the silicon layer. The light blocking layer sequence can be embedded into other materials so that it is possible to form a smooth surface from another material, which did not used in the preparation of the light blocking layer sequence. Thus, it is for example possible to integrate the light blocking sequence of layers into a CMOS process and to simultaneously fabricate a planar insulator surface thereon. Since in addition CMOS-compatible materials and process steps are used, a complete integration into the CMOS flow is possible.

In a further advantageous embodiment the a least one metal layer of the at least one light blocking layer sequence comprises a thickness of 30 nm or more. By selecting a physically associated or "corresponding" thickness, the transmission for the interesting wavelength range is reduced, for example to a value of 1% or less so that the areas of the integrated circuit located below the metal layer are effectively protected against incident radiation.

In a further embodiment the at least one metal layer is a single metal layer, which is constructed out of silver with a minimum thickness of 100 nm or out of aluminum with a minimum thickness of 30 nm or out of chromium with a minimum thickness of 75 nm or out of titanium with a minimum thickness of 100 nm or out of tungsten with a minimum thickness of 100 nm or out of copper with a minimum thickness of 80 nm. By the use of one or several of the above specified metals with the respective minimum thicknesses, at the one hand, very small transmission for light in the wavelength range from 180 nm to approximately 1200 nm is achieved, whereby simultaneously these metals typically are used in semiconductor manufacturing processes so that corresponding processes and processing units are available.

In a further embodiment several metal layers are provided, which are constructed out of one single metal each. Thus any sequence of metal layers can be used in order to adjust thereby the optical as well as also other properties of the light blocking layer sequence.

In other embodiments the at least one metal layer is constructed out of a mixture of metals which can be deposited for example by suitable deposition procedures, e.g. sputtering deposition, CVD, and the like.

The silicon layer can also be provided as a non-crystalline silicon layer, e.g. as polysilicon or as amorphous silicon, for which well established deposition procedures are available.

In an advantageous manner the silicon layer exhibits a thickness of 2 µm or more, so that in cooperation with polycrystalline structure or the amorphous structure a high absorptive capacity is resulting so that in particular the radiation back-directed by the metal layer again is efficiently absorbed.

In an advantageous embodiment, the moth eye structure has an height from 0.5 µm to 0.7 µm. As a result of this arrangement of the moth eye structure, a good coupling in the refractive index is obtained to the medium surrounding the moth eye structure, e.g. to a further insulating material so that incoming radiation becomes efficiently coupled into the silicon layer and absorbed therein.

In a further embodiment an insulator layer is applied on the moth eye structure, so that in an efficient manner further device levels of the integrated circuit can be applied.

In an advantageous embodiment, the light blocking layer sequence is arranged in an intermediate isolation layer between a first level of metallization and a second level of metallization of the integrated circuit. Thus a very efficient arrangement results in which the electrical function of the single levels of metallization are hardly disturbed so that essentially no functional restriction or higher requirements for an otherwise provided circuit in the integrated circuit are required.

In a further embodiment, the light blocking layer sequence is provide on top of a last one level of metallization of the integrated circuit. In this way the light blocking layer sequence can be efficiently applied without restriction of the levels of metallization, whereby e.g. a last layer passivating the entire circuit layer, can be provided on the light blocking layer sequence so that a reliable passivation without further labor expenditure is resulting.

In an other advantageous embodiment, at least a further light blocking layer sequence with a similar construction as the before described layer sequence is provided so that several light sensitive areas can effectively be shielded, and/or a single area of two or several light blocking layer sequences arranged one above the other (as LbS) is effectively protected.

In accordance with an other aspect of the present invention the problem is solved by a method for the preparation of a light blocking layer sequence in an integrated circuit. For this purpose, a metal layer of the light blocking layer sequence is applied onto an insulator layer whereby the metal layer possesses a transmission of less than 1% for a specified wavelength range. In a further step, a silicon layer of the light blocking layer sequence is deposited with a thickness of at least 2 µm on the metal layer. Furthermore, a moth eye structure is generated in the silicon layer. In a further step of the process the metal layer and the silicon layer of the light blocking layer sequence are structured by photolithography for the lateral limitation of the light blocking layer sequence. In a further step, a further insulator layer or a layer with passivating effect is deposited over the moth eye structure. As stated above, a high degree of compatibility is achieved with the conventional procedures for the fabrication of integrated circuits as a result of the invention process so that there is essentially no increase of the process complexity.

In the above mentioned process steps, the generation of the moth eye structure of the light blocking layer sequence can take place before the patterning or after the patterning of the metal layer and the silicon layer. As has furthermore been already stated above, the light blocking layer sequence can be provided once or several times at any suitable device level of the integrated circuit so that several light sensitive areas can effectively be protected and/or the effectiveness is increased by the fact that the same light sensitive area is protected by two or more layer sequences arranged one above the other.

The light blocking layer sequence is provided, if necessary, not only at the surface, but can be generated in different levels of an integrated device, e.g. between a first metallization and a second metallization of the circuit.

If necessary, the light blocking layer sequence in a circuit can be fabricated more often than only once in different levels or also in the same level at laterally differing positions if several differently arranged light sensitive areas are to be protected. The layer arrangement according to the invention (as metal layer and silicon layer with the moth eye structure located on top of it) can be embedded in almost any insulating layer of the integrated circuit wherein only corresponding geometric conditions and possible capacitive influences on the electrical behavior are only to be considered. In an advantageous manner, the light blocking layer sequence is applied on a planar surface which can be accomplished thereby that an insulator layer located there under is planarized by a suitable method, e.g. by chemical-mechanical polishing.

For increasing the absorption of the light blocking layer sequence, a diffractive and/or a stray structure can be applied in the surface of the silicon layer and/or the metal layer. In this case, the absorption can be particularly increased according to the wavelength dependency of the diffractive structure in the associated wavelength range of the diffractive structure.

Further embodiments are stated in the dependent claims and are apparent also from the further detailed description.

BRIEF DESCRIPTION OF THE DRAWINGS

The invention will now be explained with the aid of the drawings with reference to embodiments.

FIG. 4 shows a scheme of the process step sequence for the integration of the light blocking layer sequence into the CMOS process for an integrated circuit, starting with the process steps which take place above the silicon wafer wherein a titanium layer serves as light shielding layer as a component of the light blocking layer sequence and the light blocking layer sequence surrounded by an insulating silicon oxide layer being so thick that a smoothing of the surface by chemical-mechanical polish (CMP) can follow.

DETAILED DESCRIPTION OF EXEMPLARY EMBODIMENTS

Figure 1:
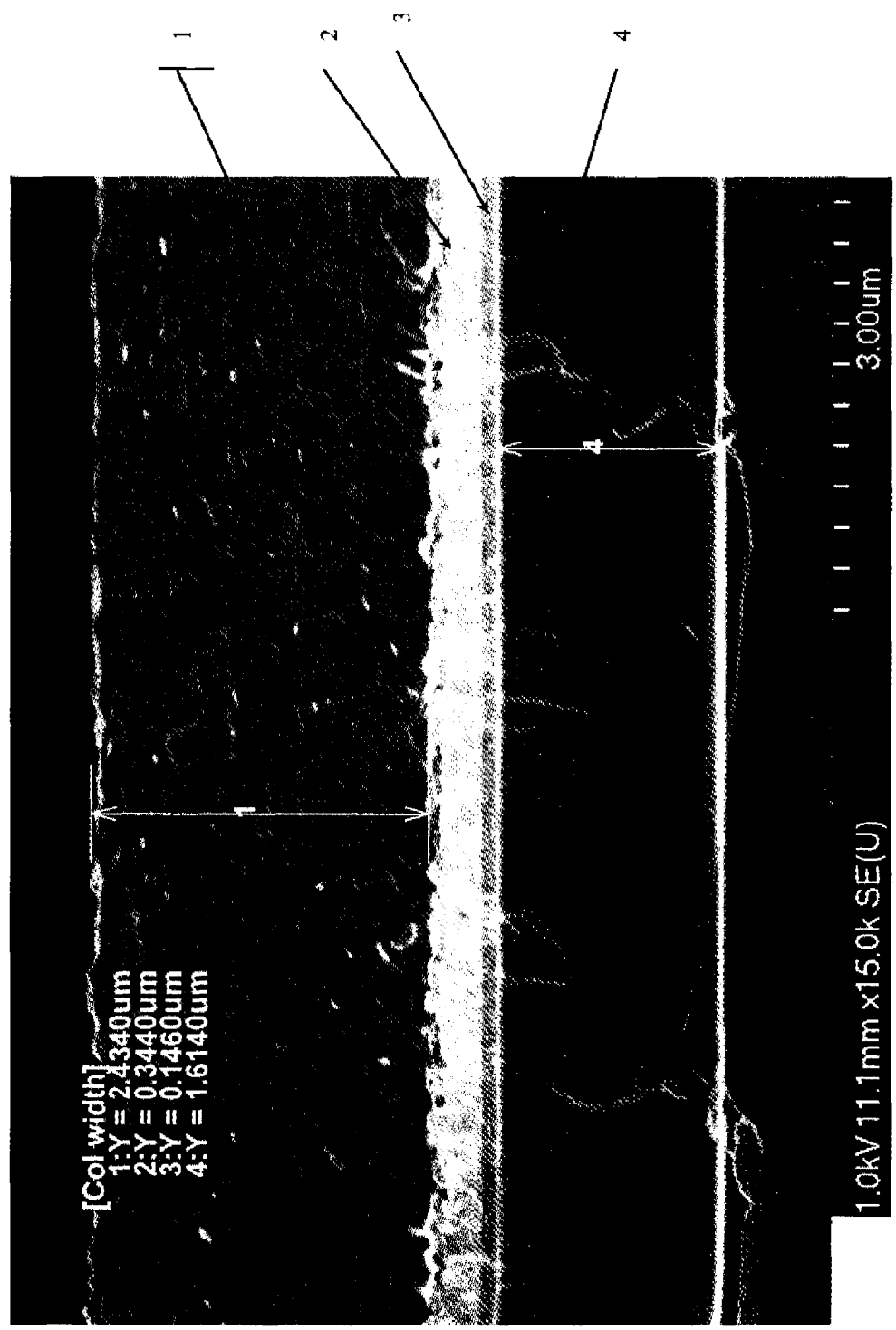
FIG. 1 shows a cross section of the light blocking layer sequence on the surface of a silicon wafer of an integrated circuit prior to the generation of the moth eye structure, in form of an electron-microscopic cross section photo after deposition of a polysilicon layer 1 whereby as light shielding metal a double layer out of titanium, titanium nitride 3 and tungsten 2 is effective occurring anyway in the CMOS technology. An insulating layer consisting out of TEOS and BPTEOS is referred to by 4.
Figure 2:
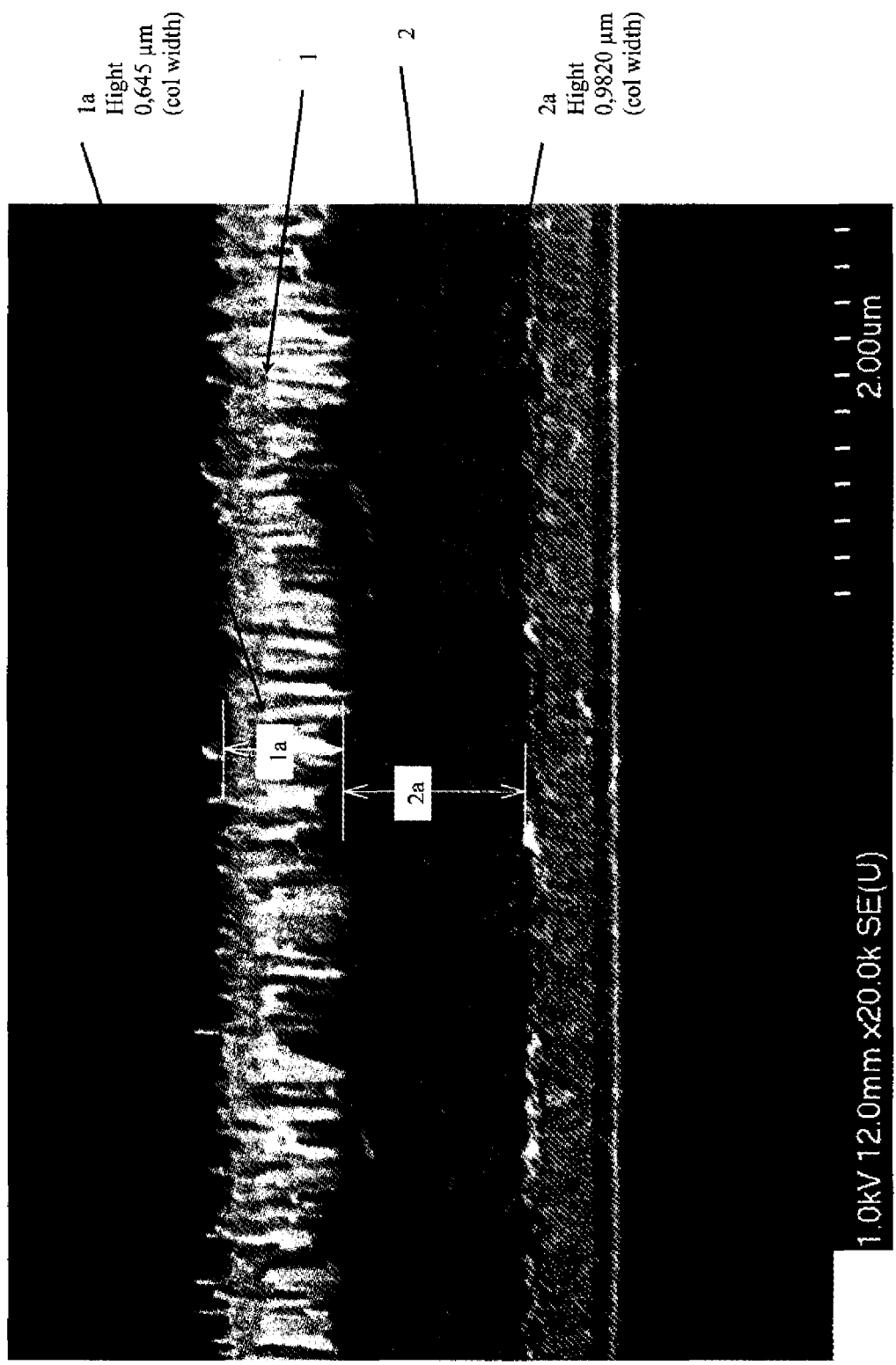
FIG. 2 shows the cross section of the light blocking layer sequence LbS in accordance with FIG. 1 with higher magnification after the development of the moth eye structure.

The FIGS. 1 and 2 show cross sectional views each of a part of an integrated circuit in form of an electron microscope photo, whereby on an insulating layer 4 a light blocking layer sequence having a metal layer which is built up from a titanium/titanium nitride layer 3 followed by a tungsten layer, and a polysilicon layer 1 is provided. Below the insulating layer 4 or within it corresponding sensitive areas are present which are to be protected against an incident radiation. Furthermore, it has to be noted that the integrated circuit is shown in a fabrication phase in which, if necessary, still another lateral limitation of the layers 1, 2 and 3 has to be made and, furthermore, the moth eye structure in the silicon layer 1 has to be manufactured.

FIG. 2 shows the integrated circuit after producing a moth eye structure, the height which, denoted here with 1a, is given to be essentially 0.645 μm. Other components of the integrated circuit as well as corresponding methods of the fabrication are explained below with reference to FIGS. 4 and 5.

Figure 3:
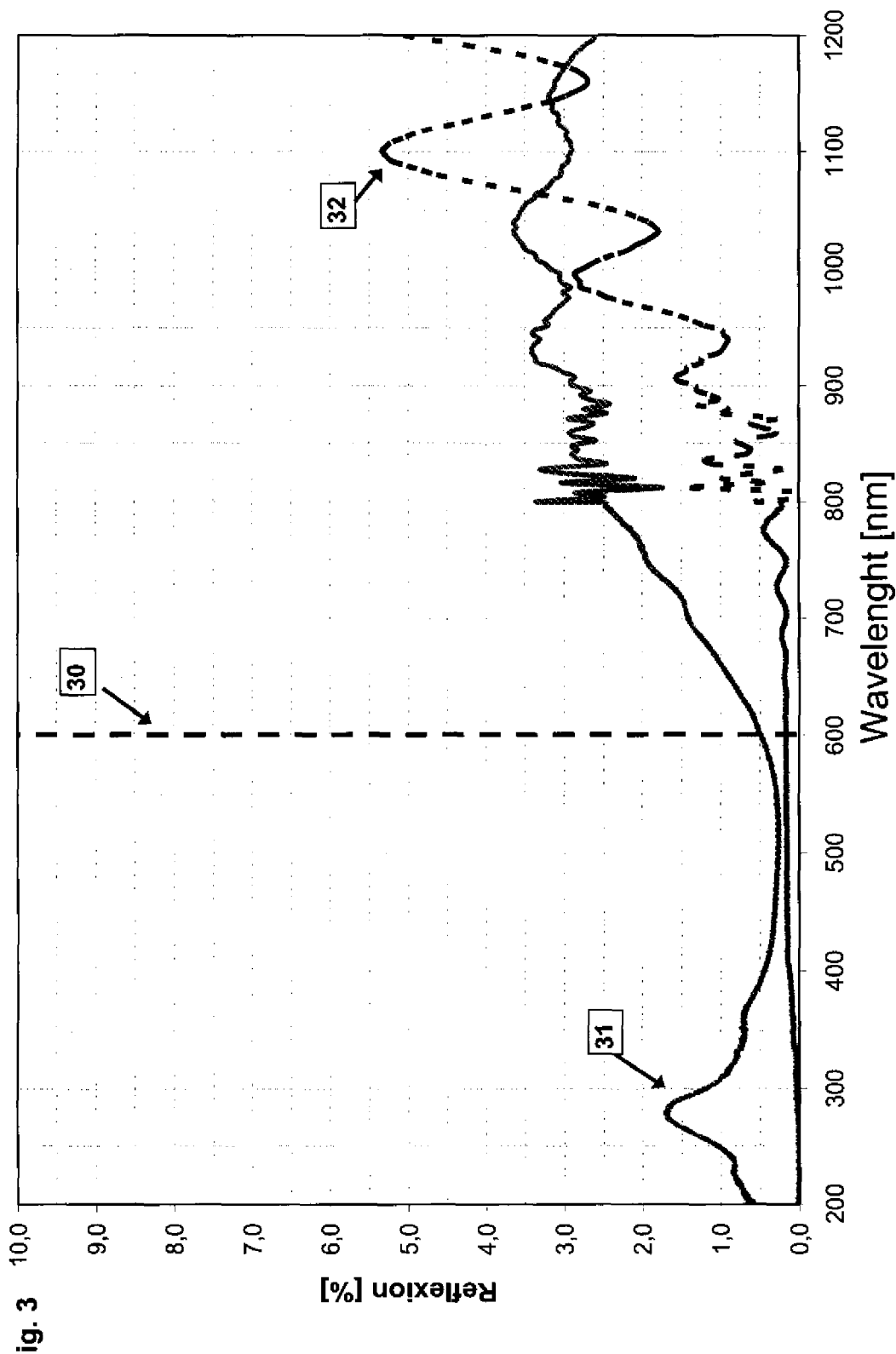
FIG. 3 shows the measured spectral reflectance with the example of the light blocking layer sequence in accordance with above example.

FIG. 3 shows the measured spectral reflectance of the light blocking layer sequence shown in FIG. 2. Therein, it is distinguished between direct reflectance 32 and the total reflectance, i.e. the sum of the direct and the stray reflectance 31. Furthermore, an auxiliary line 30 is drawn which separates the range of the complete light absorbance, in this case a wavelength of less then 600 nm, from the range of only partial absorption, i.e. a wavelength larger then 600 nm. The absorption taking place only partly for wavelengths larger then 600 nm, one can recognize very well from interferences arising. The amplitudes of the interferences increase with increased wavelength, likewise the absolute reflection values. This is because the absorption of the polysilicon layer used becomes smaller as wavelengths are becoming larger.

Figure 5:
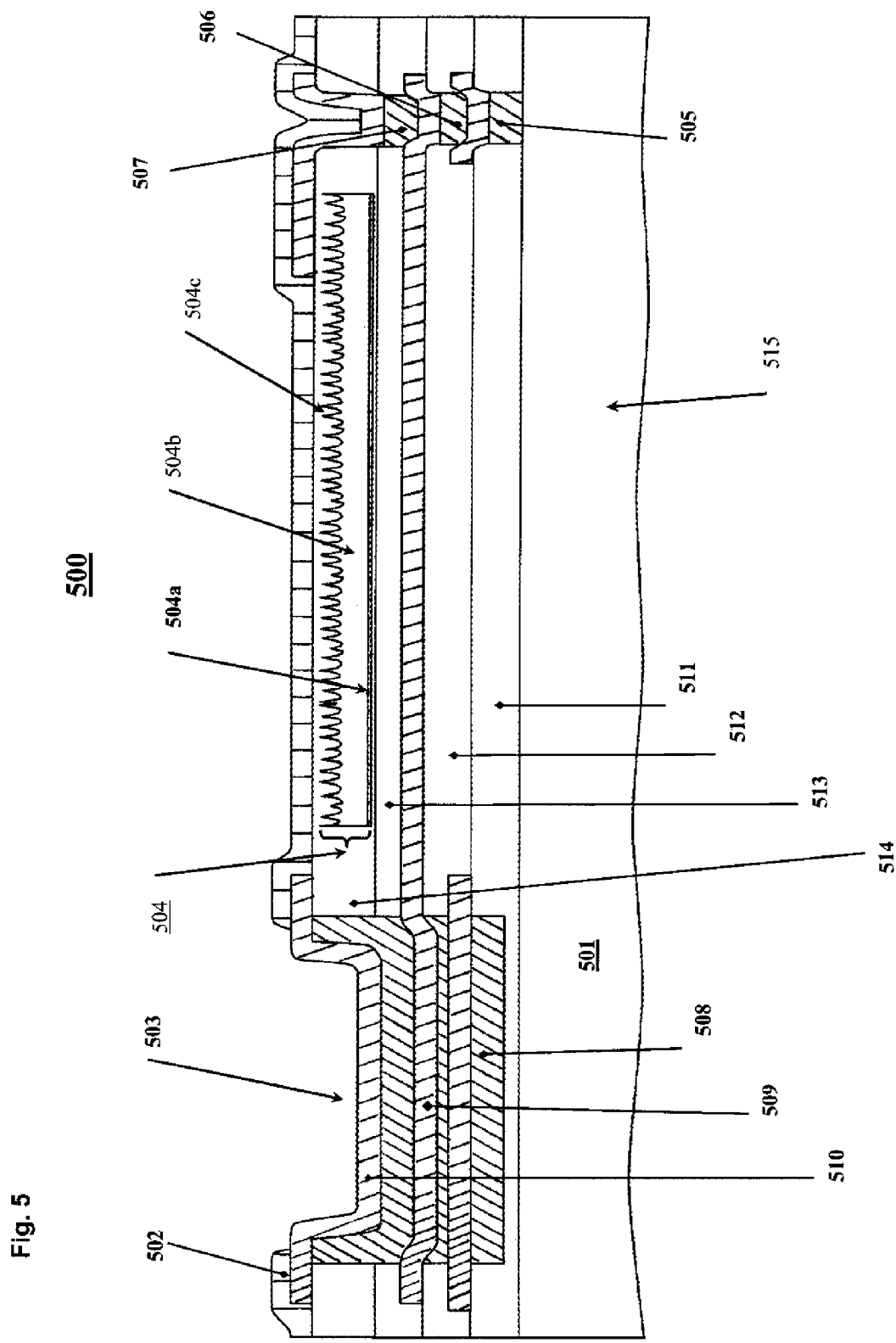
FIG. 5 shows a simplified cross sectional view of the light blocking sequence of layers LbS and its arrangement within a CMOS metallization system (as back end) of an integrated circuit 500.
Figure 1:
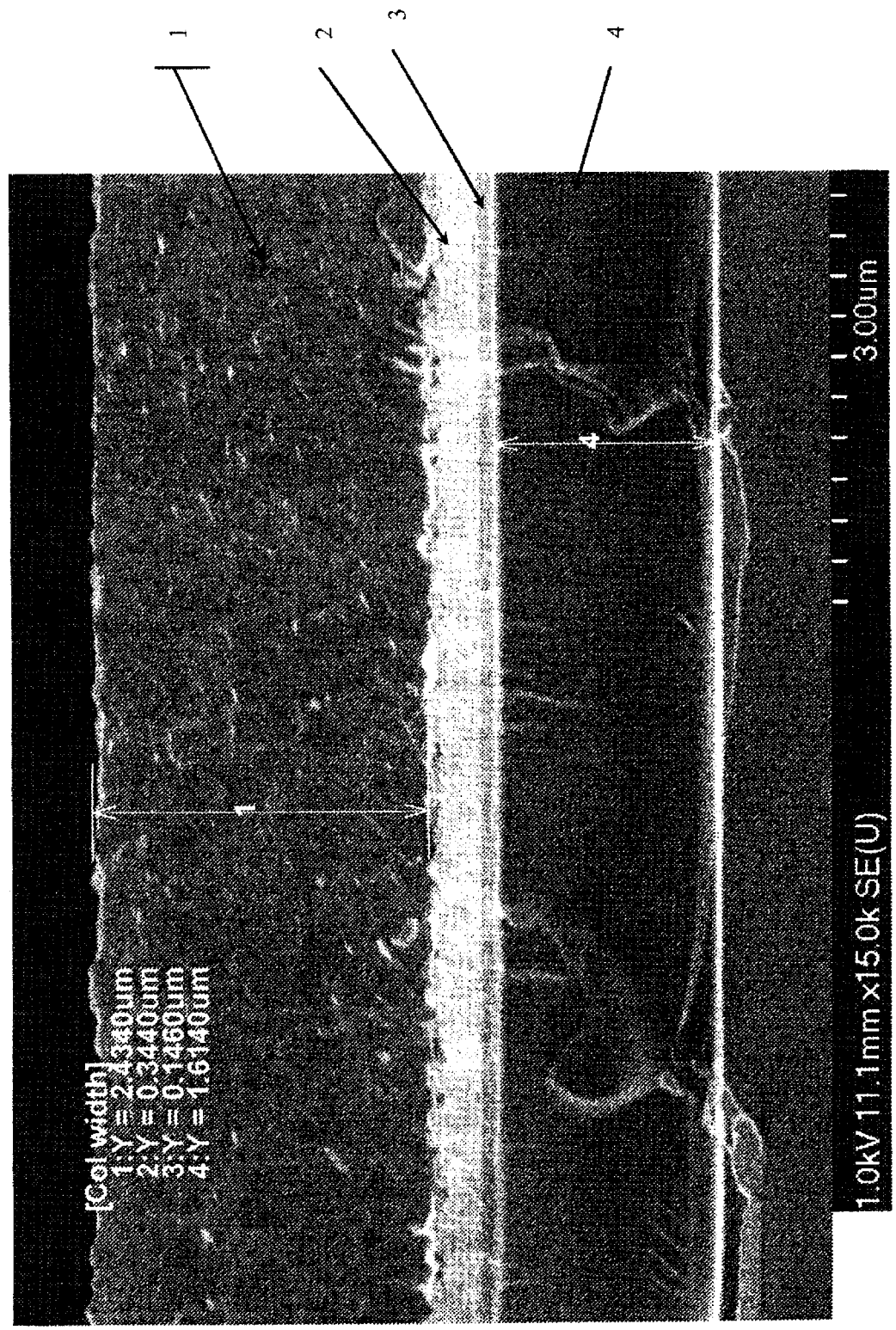
Figure 2:
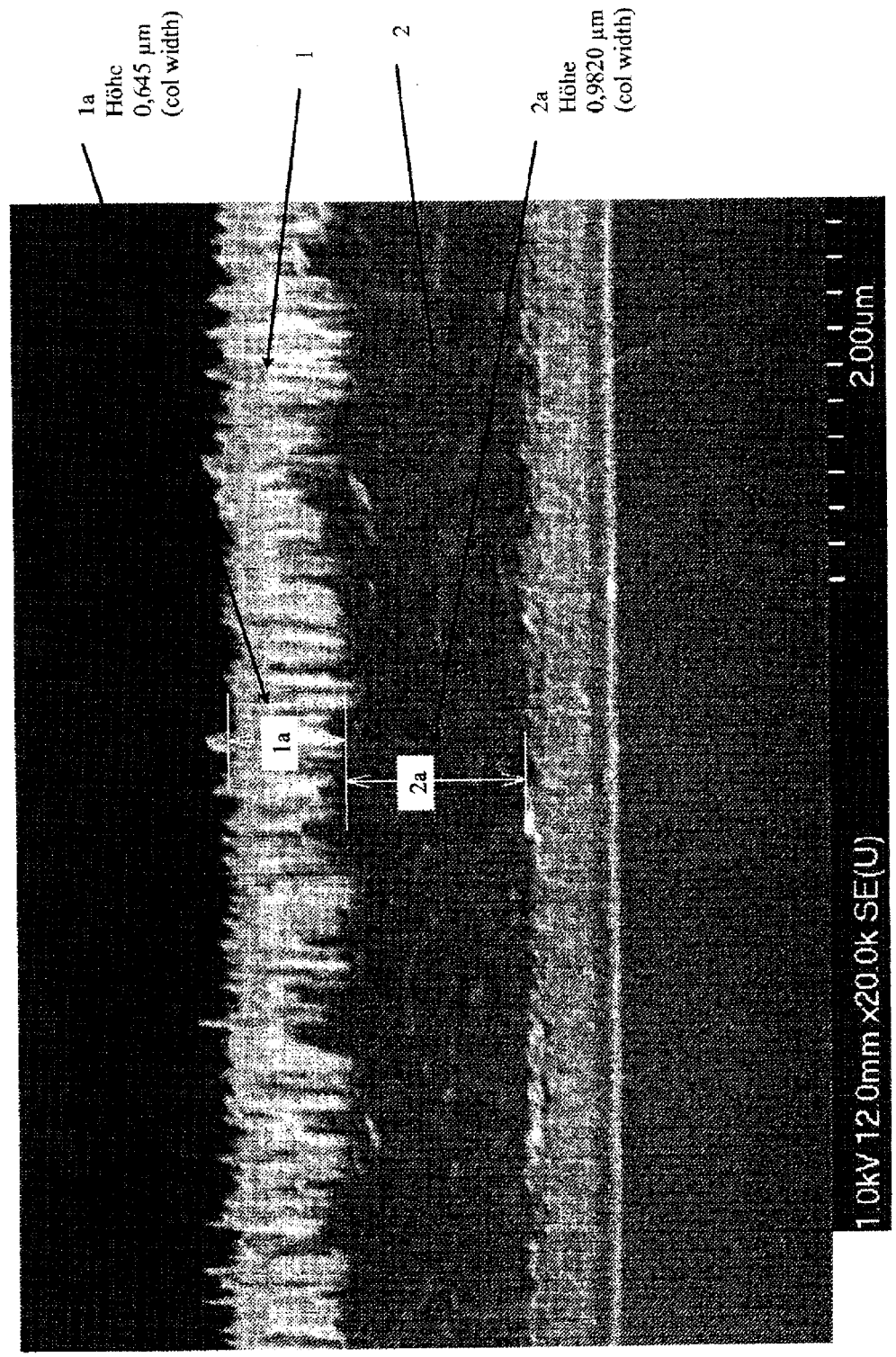

With reference to the FIGS. 4 and 5, a procedure for the fabrication of an integrated circuit 500 with a light blocking layer sequence is described, like it has been explained for example above with reference to the FIGS. 1 to 3.

In accordance with the process flow listed in FIG. 4, first of all corresponding circuit elements, e.g. transistors, capacitors, resistors, and the like, are manufactured in a suitable area in and above a semiconductor layer, e.g. a silicon layer according to the requirements of the circuit construction. For the sake of simplicity, such well known devices, manufacturing methods and process steps are not shown in the FIGS. 4 and 5.

In FIG. 4, the listed process flow for the fabrication of the integrated circuit 500 begins with the application of an electrical insulating layer "ILD 1", in FIG. 5 also designated as 511, after which follows the opening of the contacts "Contact", also designated in FIG. 5 as 505, and the first metallization layer "Met 1" or 508, respectively. Thereafter follows the deposition of an isolation intermediate layer ILD 2 or 512, respectively, and the opening of the contact holes for the first level of metallization "via 1" or 506, respectively and the deposition of the metal for the second level of metallization "Met 2" or 509, respectively. Afterwards an other electrical insulating layer "ILD 3" or 513, respectively, is generated and thereon subsequently thereto a 100 nm thick titanium layer 504a and there upon a 2 μm thick polysilicon layer 504b of a light blocking layer sequence 504 are deposited. Subsequently, the layer sequence 504 is structured by applying the photoresist "Resist", exposing the photoresist "Exposure", curing with UV light "UV Hardening", etching the polysilicon 504a "Polyetch" and the titanium 504a "Ti etch" for laterally delimiting the layer sequence 504.

Thus the lateral dimensions the dimensions of a area 515 to be blocked are adapted where after the photoresist is striped at "Resist strip". By means of plasma etching a moth eye structure 504c is now generated at "Black SI Etch" in a known manner wherein the etching process exhibits a high selectivity to oxide and therefore becomes effective only in the polysilicon. The needle shaped structures resulting there from serve for wide-band blooming of the silicon boundary surface vis-á-vis the subsequently adjacent medium and cause in combination with the absorbing property of the silicon layer, the drastic reduction of the reflectance contrary to the prior art methods of light screening by simple metal layers. A subsequently deposited oxide layer of 514 "Oxides dep" covers the layer sequence 504, the chemical-mechanical polish "CMP" generates planar insulator surface into which the contact holes 507 for the second level of metallization "Via 2" are introduced. There follow the steps of applying the third level of metallization "Met 3" or 510, respectively, applying a final passivation layer "Passivation" and the opening of the contacting islands (or: connecting lands) 503 as "Pad opening".

FIG. 5 shows again a sketchy representation of the light blocking sequence of layers 504 in an exemplary arrangement within a CMOS back end of the integrated circuit 500. 501 is the substrate, 515 is the area of the circuit to be shielded against incident radiation, 502 is the passivation layer, 503 is a bond pad, 504 is the light blocking Sequence of layers with the metal layer 504a and the silicon layer 504b and the moth eye structure 504c, 505 is a contact, 506 are the contact openings "Via 1", 507 are the contact openings "Via 2", 508 is the first level of metallization "Met 1", 509 is the second level of metallization "Met 2", 510 is the third level of metallization "Met 3", 511 is the first intermediate layer isolation "ILD 1", 512 is the second intermediate layer isolation "ILD 2", 513 is the third intermediate layer isolation "ILD 3" and 514 is planarized oxide layer enclosing the light blocking sequence of layers. In the example shown, the light blocking sequence of layers 504 is placed in the insulator layer 513 together with the layer 514 between the second and the third level of metallization "Met 2" and "Met 3". The insulating layer between these levels of metallization has been divided up thereby into two insulating layers of which the layer 513 is applied before the deposition of the light blocking layer sequence 504 and one, the oxide layer 514, is applied after the formation thereof. The total thickness of the insulating layer between the second level of metallization "Met 2" and the third level of metallization "Met 3" is enlarged. Each metallization layer can completely be used for the wiring. Only directly in the area of the light blocking layer 504, vias between the levels of metallization disposed below and above, are not possible.

As already explained above, a layer sequence equivalent to the light blocking layer sequence 504 can be provided at any other position of the integrated circuit 500 in addition to the layer sequence 504. For example a corresponding layer sequence, which likewise is formed out of a metal layer, a silicon layer formed thereon and a moth eye structure generated therein, can be provided in one of the intermediate layer isolations at any suitable lateral position in order to protect thereby a light sensitive area optionally disposed there under.

In other apparent embodiments (not shown) a corresponding further light blocking layer sequence can be provided above or underneath layer sequence 504 shown in FIG. 5 with approximately the same lateral dimensions and about in the same lateral position so that an altogether even more efficient blocking of incident light for the area 515 and also a corresponding smaller back reflection are resulting. For this purpose, the process steps described with respect to FIG. 4, can be carried out in same way after a completion of an insulating layer. Therein, however, different materials, if necessary, corresponding to the manufacturing strategy can be used, e.g. in the form of other metal layers and, if necessary, also diffractive structures in the metal layers and/or the polysilicon layer in case a certain wavelength range is to be especially considered.

In further embodiments, several layer sequences 504 are arranged one above the other wherein the individual layer sequences possess the same principle structure, but can, however, be different in the metals, the depth of the moth eye structure, as well as the presence of diffractive structures.

In further embodiments, a light blocking layer sequence is provided for optical systems in circuits with integrated optics for shading of light sensitive areas which do not belong to the receiving elements of the optical radiation with most extensive suppression of the reflectance of the layers used for shading by an increased absorption in the wavelength range of <180 nm to 1200 nm. The layer sequence consists out of one or several thin metal layers and a polysilicon layer or an amorphous silicon layer located on top, wherein the surface of the silicon layer is provided with a moth eye structure and the light blocking layer sequence is covered at least on one side by an electrical insulator layer.

In a further embodiment, a layer consisting out of the metals with the minimum layer thicknesses: Ag: 100 nm, Al: 30 nm, CR: 75 nm, Ti: 100 nm, W: 100 nm Cu: 80 nm, is present as metallic component of the light blocking layer sequence each.

In a further embodiment, several metal layers each of the metals specified above are present with a correspondingly reduced layer thickness as a metallic component of the light blocking layer sequence.

In a further embodiment, the thickness of the silicon layer amounts to at least 2 μm and the moth eye structure formed therein reaches a structural height of preferably 0.5 to 0.7 μm.

In a further embodiment, a method is provided for the preparation of a light blocking layer sequence for the protection of certain areas of a CMOS device of the integrated optics which are not to be met by light, operating in the wavelength range of smaller then 180 nm to 1200 nm, wherein before the deposition the layer passivating the entire circuit on an electrical insulator layer a metal layer with a thickness, which shows a transmission of less then 1%, and whereupon an at least 2 μm thick polysilicon layer or amorphous silicon layer are deposited, after which the two layers are structured by means of an optical lithography process and a moth eye structure of a depth from preferably 0.5 to 0.7 μm is formed on top of the silicon layer after which follows the deposition of an other electrical insulator layer or the like with a passivating effect.

In a further embodiment, a light blocking layer sequence is formed either at the surface of the circuit or with several levels of metallization being present between one of the levels of metallization.

In a further embodiment, a light blocking layer sequence is formed at the surface of the circuit and with several levels of metallization being present between one of the levels of metallization.

In a further embodiment, the light blocking layer sequence with several levels of metallization being present, is formed a multiple times each between one of the levels of metallization.

I claim as my invention:

1. Method for the fabrication of a light blocking layer sequence in an integrated circuit comprising the steps of:
    applying a first metal layer of the light blocking layer sequence on a first insulator layer where the first metal layer has a transmission of less than 1% for a specified wavelength range;
    depositing a silicon layer of the light blocking layer sequence with a thickness of at least 2 μm on the first metal layer;
    producing a moth eye structure in the silicon layer;
    patterning of the first metal layer and the silicon layer of the light blocking layer sequence by photolithography for laterally delimiting the light blocking layer sequence; and
    depositing a second insulator layer or a layer with passivating effect on top of the moth eye structure.

2. The method of fabrication according to claim 1, wherein the specified wavelength range is 180 nm to 1200 nm.

3. The method of fabrication according to claim 1, wherein the moth eye structure is generated with a depth range from 0.5 to 0.7 μm.

4. The method of fabrication according to claim 1, wherein the first metal layer is provided as a layer with several sub-layers, each of the several sub-layers is formed of one single metal grade.

5. The method of fabrication according to claim 4, wherein the first metal layer comprises at least one of the following metal grades: silver, aluminum, chromium, titanium, tungsten, and copper.

6. The method of fabrication according to claim 1, wherein the first metal layer is produced of a single metal grade selected from the following metal grades with a minimum layer thicknesses: silver with a minimum layer thickness of 100 nm, aluminum with a minimum layer thickness of 30 nm, chromium with a minimum layer thickness of 75 nm, titanium with a minimum layer thickness of 100 nm, tungsten with a minimum layer thickness of 100 nm and copper with a minimum layer thickness of 80 nm.

7. The method of fabrication according to claim 1, further comprising:
    fabricating at least a lower level of metallization prior to applying the first metal layer of the light blocking layer sequence.

8. The method of fabrication according to claim 1, further comprising:
fabricating an upper level of metallization after depositing the second insulator layer or the layer with a passivating effect.

9. The method of fabrication according to claim 1, further comprising:
applying a layer passivating the entire integrated circuit, after applying the first metal layer and the silicon layer of the light blocking layer sequence.

10. The method of fabrication according to one of claim 1, further comprising:
fabricating at least one another light blocking layer sequence with a second metal layer and another silicon layer.

11. The method of fabrication according to claim 10, wherein the at least one another light blocking layer sequence is prepared before that light blocking layer sequence, which layer sequence is a highest component of the integrated circuit, before applying the layer passivating the entire integrated circuit.

12. The method of fabrication according to claim 1, wherein producing the moth eye structure of the light blocking layer sequence is done before the patterning of the first metal layer and the silicon layer of the light blocking layer sequence.

13. The method of fabrication according to claim 1, wherein producing the moth eye structure of the light blocking layer sequence is done after the patterning of the first metal layer and the silicon layer of the light blocking layer sequence.

* * * * *

UNITED STATES PATENT AND TRADEMARK OFFICE
CERTIFICATE OF CORRECTION

| | | |
|---|---|---|
| PATENT NO. | : 8,187,908 B2 | |
| APPLICATION NO. | : 12/740554 | |
| DATED | : May 29, 2012 | |
| INVENTOR(S) | : Gaebler | |

It is certified that error appears in the above-identified patent and that said Letters Patent is hereby corrected as shown below:

Delete figs. 1-2 and substitute therefor the drawing sheets, consisting of figs. 1-2 as shown on the attached pages.

Signed and Sealed this
Twenty-sixth Day of February, 2013

Teresa Stanek Rea
*Acting Director of the United States Patent and Trademark Office*